(12) United States Patent
Imai et al.

(10) Patent No.: US 10,431,721 B2
(45) Date of Patent: Oct. 1, 2019

(54) LIGHT-EMITTING DEVICE AND METHOD FOR MANUFACTURING SAME

(71) Applicants: CITIZEN ELECTRONICS CO., LTD., Fukiyoshida-shi, Yamanashi (JP); CITIZEN WATCH CO., LTD., Nishitokyo-shi, Tokyo (JP)

(72) Inventors: Sadato Imai, Yamanashi (JP); Tatsuya Katoh, Ebina (JP); Masahiro Watanabe, Yamanashi (JP); Kazuki Matsumura, Fuefuki (JP)

(73) Assignees: CITIZEN ELECTRONICS CO., LTD., Fujiyoshida-Shi, Yamanashi (JP); CITIZEN WATCH CO., LTD., Nishitokyo-Shi, Tokyo (JP)

( * ) Notice: Subject to any disclaimer, the term of this patent is extended or adjusted under 35 U.S.C. 154(b) by 0 days.

(21) Appl. No.: 15/744,318

(22) PCT Filed: Jan. 11, 2017

(86) PCT No.: PCT/JP2017/000661
§ 371 (c)(1),
(2) Date: Jan. 12, 2018

(87) PCT Pub. No.: WO2017/134994
PCT Pub. Date: Aug. 10, 2017

(65) Prior Publication Data
US 2018/0204986 A1    Jul. 19, 2018

(30) Foreign Application Priority Data
Feb. 2, 2016 (JP) .................. 2016-017986

(51) Int. Cl.
*H01L 27/15* (2006.01)
*C09K 11/55* (2006.01)
(Continued)

(52) U.S. Cl.
CPC ........ *H01L 33/504* (2013.01); *H01L 25/0753* (2013.01); *H01L 27/156* (2013.01);
(Continued)

(58) Field of Classification Search
CPC ................. H01L 33/504; H01L 33/502; H01L 2224/48091; H01L 2924/00014;
(Continued)

(56) References Cited

U.S. PATENT DOCUMENTS

2003/0080341 A1    5/2003   Sakano et al.
2005/0224821 A1*  10/2005  Sakano ................. B29C 67/08
                                                                257/79
(Continued)

FOREIGN PATENT DOCUMENTS

JP    H11-040858 A    2/1999
JP    2003-101074 A   4/2003
(Continued)

OTHER PUBLICATIONS

International Search Report and Written Opinion for related PCT App No. PCT/JP2017/000661 dated Apr. 4, 2017, 15 pgs.

*Primary Examiner* — Brian Turner
(74) *Attorney, Agent, or Firm* — Procopio, Cory, Hargreaves & Savitch LLP

(57) ABSTRACT

Provided is a light-emitting device and a method for manufacturing the same which avoid a distinct color unevenness during the light emission even if variations are present among the light-emitting elements in the concentration of the phosphor that precipitates in the resin for sealing the light-emitting elements. The light-emitting device includes a substrate, a plurality of light-emitting elements that are mounted on the substrate, a first resin layer that integrally seals the light-emitting elements and includes a first phosphor that is excited by light from the light-emitting elements (Continued)

at a concentration that is high as it goes to a lower end near the substrate from an upper end distant from the substrate, and a second resin layer that is provided at an upper side of the first resin layer and includes a second phosphor that is excited by light from the light-emitting elements at a uniform concentration.

7 Claims, 7 Drawing Sheets

(51) Int. Cl.
    *H01J 1/62*     (2006.01)
    *H01L 33/56*     (2010.01)
    *H05B 33/14*     (2006.01)
    *H01L 33/50*     (2010.01)
    *H01J 63/04*     (2006.01)
    *H01L 33/52*     (2010.01)
    *H01L 25/075*     (2006.01)
    *H01L 33/62*     (2010.01)

(52) U.S. Cl.
    CPC .............. *H01L 33/52* (2013.01); *H01L 33/62* (2013.01); *H01L 2224/48091* (2013.01); *H01L 2224/48137* (2013.01); *H01L 2933/005* (2013.01); *H01L 2933/0041* (2013.01)

(58) Field of Classification Search
    CPC ... H01L 2933/0041; H01L 2224/16225; H01L 2224/48247; H01L 2224/48257; H01L 2224/73253; H01L 2924/1619
    See application file for complete search history.

(56) References Cited

U.S. PATENT DOCUMENTS

| | | | |
|---|---|---|---|
| 2008/0231170 A1* | 9/2008 | Masato | C09K 11/565 |
| | | | 313/501 |
| 2008/0303411 A1* | 12/2008 | Ohta | C09K 11/02 |
| | | | 313/503 |
| 2012/0025739 A1* | 2/2012 | Tomiyoshi | H05K 1/142 |
| | | | 315/312 |
| 2012/0032578 A1* | 2/2012 | Annen | B82Y 30/00 |
| | | | 313/483 |
| 2015/0340547 A1 | 11/2015 | Tamaki | |
| 2016/0027971 A1 | 1/2016 | Anc | |
| 2017/0069801 A1* | 3/2017 | Oka | H01L 33/486 |

FOREIGN PATENT DOCUMENTS

| | | |
|---|---|---|
| JP | 2003-179269 A | 6/2003 |
| JP | 2005-093896 A | 4/2005 |
| JP | 2007042687 A | 2/2007 |
| JP | 2013-077679 A | 4/2013 |
| JP | 2013110227 A | 6/2013 |
| JP | 2016-001735 A | 1/2016 |

* cited by examiner

LIGHT-EMITTING DEVICE AND METHOD FOR MANUFACTURING SAME

TECHNICAL FIELD

The present invention relates to a light-emitting device and a method for manufacturing the same.

Background Art

A chip-on-board (COB) light-emitting device in which light-emitting elements, such as light-emitting diode (LED) elements, are mounted on a general-purpose substrate, such as a ceramic substrate or a metal substrate, is known. In such a light-emitting device, by sealing the LED elements with a translucent resin containing a phosphor, and by mixing light from the LED elements and light obtained by exciting the phosphor by the light from the LED elements, white light or the like can be obtained depending on the intended use.

For such a light-emitting device, to improve the heat dissipation and suppress variations of the chromaticity, a manufacturing method in which the LED elements are sealed with an uncured resin in which a phosphor is dispersed, the phosphor is precipitated (settled), and then the resin is cured is known. For example, Patent Literature 1 discloses a light-emitting diode that includes an LED chip provided on a support medium, and a coating unit including a phosphor that absorbs at least a part of light emission from the LED chip to perform the wavelength conversion and emit light and is formed on the LED chip and on the support medium other than the LED chip. The coating unit is formed by dispersing the phosphor in the gas phase or the liquid phase and settling the phosphor.

Patent Literature 2 discloses a light-emitting device in which an LED chip on a substrate is sealed with a translucent resin which includes no phosphor, a resin layer including a phosphor is formed thereon so as to have a uniform thickness, and accordingly, the color unevenness is not likely to occur compared to a case where the phosphor is dispersed in the translucent resin.

CITATION LIST

Patent Literature

Patent Literature 1: Japanese Unexamined Patent Publication (Kokai) No. 11-040858
Patent Literature 2: Japanese Unexamined Patent Publication (Kokai) No. 2003-101074

SUMMARY OF INVENTION

When a light-emitting element is sealed with an uncured resin in which a phosphor is dispersed and the phosphor is precipitated, in the process of lowering the viscosity of the resin, a flow occurs in the resin and the phosphor also flows. Especially, when a plurality of light-emitting elements are mounted on a single substrate, the flow of the resin may change depending on the location, and thus variations are likely to occur on the precipitation state (concentration) of the phosphor. Accordingly, when a plurality of light-emitting elements are mounted on a single substrate, compared to when a single light-emitting element is mounted on a single substrate, variations are caused to the concentration of the phosphor among the light-emitting elements, and this leads to distinct variations (color unevenness) of the light emission.

An object of the present invention is to provide a light-emitting device and a method for manufacturing the same which avoid a distinct color unevenness during the light emission even if variations are present among the light-emitting elements in the concentration of the phosphor that precipitates in the resin for sealing the light-emitting elements.

Provided is a light-emitting device including a substrate, a plurality of light-emitting elements that are mounted on the substrate, a first resin layer that integrally seals the plurality of light-emitting elements and includes a first phosphor that is excited by light from the plurality of light-emitting elements at a concentration that is high as it goes to a lower end near the substrate from an upper end distant from the substrate, and a second resin layer that is provided at an upper side of the first resin layer and includes a second phosphor that is excited by light from the plurality of light-emitting elements at a uniform concentration.

Preferably, in the above light-emitting device, the concentration of the second phosphor in the second resin layer is lower than the concentration of the first phosphor at the lower end of the first resin layer, and the concentration of the second phosphor in the second resin layer is higher than the concentration of the first phosphor at the upper end of the first resin layer.

Preferably, in the above light-emitting device, the upper end of the first resin layer is a transparent resin layer that does not include the first phosphor.

Further, provided is a method for manufacturing a light-emitting device including the steps of mounting a plurality of light-emitting elements on a substrate, integrally sealing the plurality of light-emitting elements using an uncured resin that includes a first phosphor excited by light from the plurality of light-emitting elements and thereby forming a first resin layer, precipitating the first phosphor at a side of the substrate while keeping the first resin layer in an uncured state, curing the first resin layer, and providing, at an upper side of the first resin layer, a second resin layer that includes a second phosphor excited by light from the plurality of light-emitting elements at a uniform concentration.

According to the above light-emitting device and the method for manufacturing the same, a distinct color unevenness is avoided during the light emission even if variations are present among the light-emitting elements in the concentration of the phosphor that precipitates in the resin for sealing the light-emitting elements.

DESCRIPTION OF EMBODIMENTS

Hereinafter, with reference to the accompanying drawings, a light-emitting device and a method for manufacturing the same will be explained in detail. However, it should be noted that the present invention is not limited to the drawings or the embodiments described below.

Figure 1:
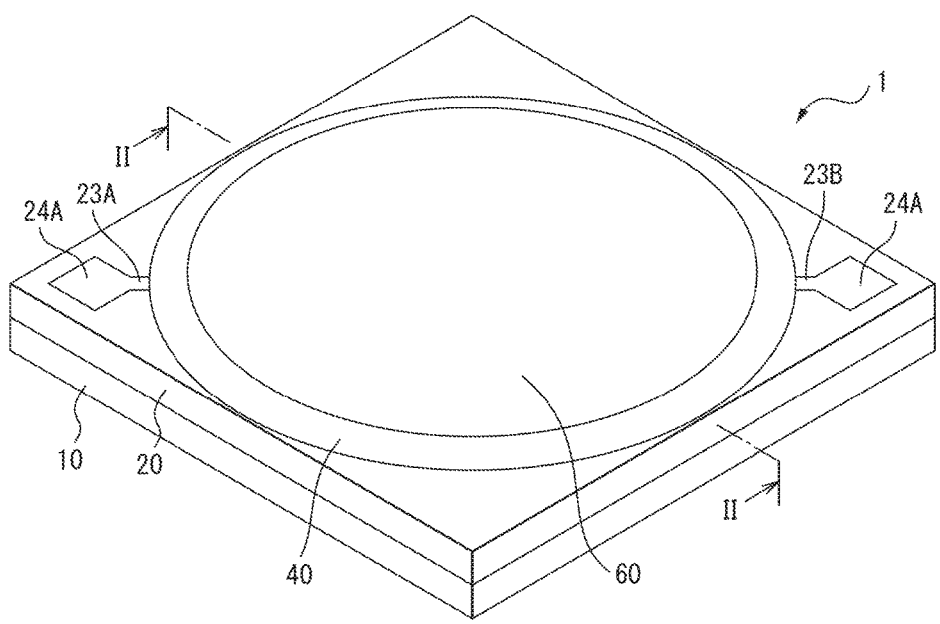
FIG. 1 is a perspective view of a light-emitting device 1.
Figure 2:
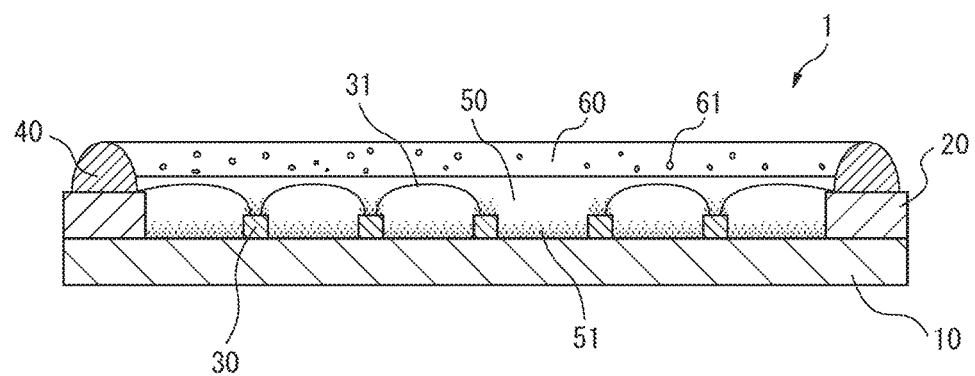
FIG. 2 is a cross-sectional view taken along a line II-II of FIG. 1.

FIG. 1 is a perspective view of a light-emitting device 1. FIG. 2 is a cross-sectional view taken along a line II-II of FIG. 1. The light-emitting device 1 includes LED elements as the light-emitting elements, and is used as, for example, various lighting LED light source devices. The light-emitting device 1, as main components, includes a mounted substrate 10, a circuit substrate 20, LED elements 30, a resin frame 40, a precipitation phosphor layer 50, and a dispersion phosphor layer 60.

As an example, the mounted substrate 10 is a square metal substrate and has, at a center of an upper surface thereof, a circular mounting area 11 (see FIG. 3 which is described later) on which the LED elements 30 are mounted. The mounted substrate 10 functions as a heat radiation substrate that radiates the heat generated by the LED elements 30 and particles of the phosphor described later, and thus, is configured from, for example, aluminum having excellent heat tolerance and heat dissipation. However, the material of the mounted substrate 10 may be other metals such as copper, as long as the material has excellent heat tolerance and heat dissipation.

Figure 3:
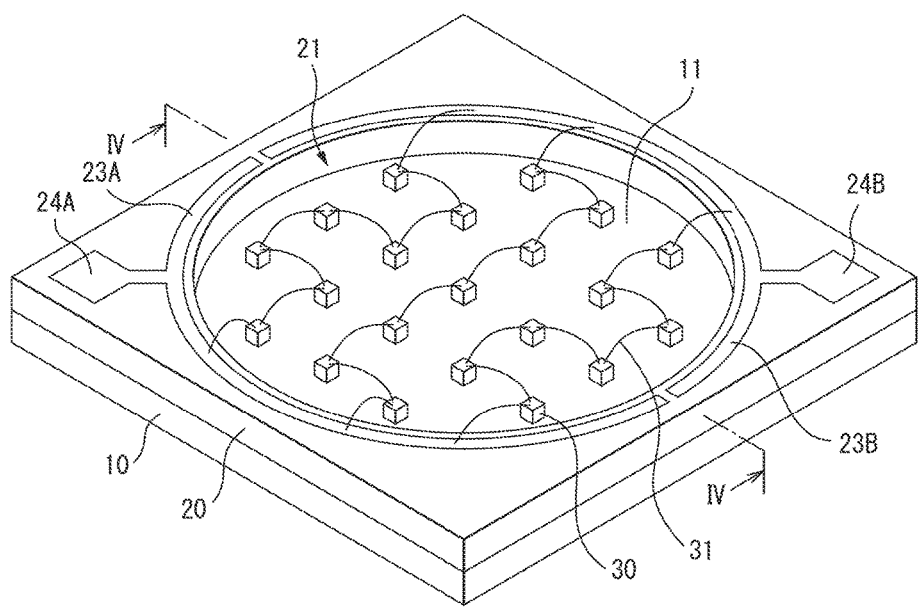
FIG. 3 is a perspective view for illustrating the arrangements of the circuit substrate 20 and the LED elements 30.
Figure 4:
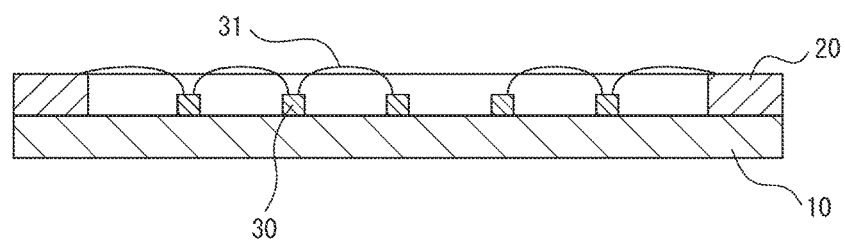
FIG. 4 is a cross-sectional view taken along a line IV-IV of FIG. 3.

FIG. 3 is a perspective view for illustrating the arrangements of the circuit substrate 20 and the LED elements 30. FIG. 4 is a cross-sectional view taken along a line IV-IV of FIG. 3.

As an example, the circuit substrate 20 has the same square shape as that of the mounted substrate 10 and has, at the center thereof, a circular opening 21. The undersurface of the circuit substrate 20 is, for example, via an adhesive sheet, pasted and fixed on the mounted substrate 10. At one side of the upper surface of the circuit substrate 20, a conductive pattern 23A is formed and at the other side, a conductive pattern 23B is formed respectively so as to surround the opening 21. At one diagonal corner on the upper surface of the circuit substrate 20, a connection electrode 24A is formed and at the other diagonal corner, a connection electrode 24B is formed respectively. One of the connection electrodes 24A and 24B is an anode electrode and the other is a cathode electrode, and these electrodes are connected to an external power source to receive a voltage so that the light-emitting device 1 emits light.

The LED elements 30 are one example of the light-emitting elements, and are for example, LED elements such as gallium nitride-based compound semiconductors that emit light of the wavelength ranging from the ultraviolet region to the blue region. Hereinafter, it is assumed that the LED elements 30 are blue LEDs that emit blue light having, for example, the light emission wavelength band of around 450 to 460 nm. However, the LED elements 30 may be elements that emit light of other wavelengths such as violet light or ultraviolet light. In the light-emitting device 1, on the mounting area 11 of the mounted substrate 10 that is exposed in the opening 21 of the circuit substrate 20, a plurality of LED elements 30 are arrayed and mounted in a lattice manner. FIG. 3 illustrates a case where especially twenty-one LED elements 30 are mounted. The undersurfaces of the LED elements 30 are, via for example a transparent insulating adhesive, fixed to the upper surface of the mounted substrate 10.

Each LED element 30 has, on the upper surface thereof, a pair of element electrodes, and as illustrated in FIG. 3 and FIG. 4, element electrodes of adjacent LED elements 30 are, via a bonding wire 31 (hereinafter, simply referred to as wire 31), electrically connected to each other. Wires 31 from the LED elements 30 that are located at the outer peripheral side of the opening 21 are connected to the conductive pattern 23A or the conductive pattern 23B of the circuit substrate 20. This supplies a current to each LED element 30 via the wires 31.

The resin frame 40 is a circular frame configured from, for example, a white resin in accordance with a size of the opening 21 of the circuit substrate 20, and is fixed at a position overlapping with the conductive patterns 23A and 23B that are formed to hem the opening 21 on the upper surface of the circuit substrate 20. The resin frame 40 is a dam material for preventing the outflow of the resin of the precipitation phosphor layer 50 and the dispersion phosphor layer 60, and causes light laterally emitted from the LED elements 30 to reflect toward the upside of the light-emitting device 1 (opposite side of the mounted substrate 10 as viewed from the LED elements 30).

The precipitation phosphor layer 50 is one example of the first resin layer, and is configured from a transmissive resin including a phosphor 51 that is a first phosphor. The precipitation phosphor layer 50 fills, as illustrated in FIG. 2, a space that is surrounded by the resin frame 40 and is on the mounted substrate 10 up to a position higher than the upper ends of the wires 31, and integrally covers and protects (seals) the LED elements 30 and the wires 31. For the precipitation phosphor layer 50, for example, a colorless and transparent thermosetting resin such as epoxy resin or silicone resin is used.

The phosphor 51 is a yellow phosphor such as yttrium aluminum garnet (YAG), and the particles thereof are precipitated in the lower part of the precipitation phosphor layer 50. In other words, the precipitation phosphor layer 50 includes the phosphor 51 that is excited by the light from the LED elements 30 at the concentration that is high as it goes to the lower end near the mounted substrate 10, from the upper end that is distant from the mounted substrate 10. In FIG. 2, the precipitation of the particles of the phosphor 51 in the precipitation phosphor layer 50 is represented by the pattern of light and shade. Actually, as illustrated in FIG. 2, the phosphor 51 precipitates not only on the upper surface of the mounted substrate 10 but also on the upper surfaces of the LED elements 30.

The light-emitting device 1 emits white light obtained by mixing the blue light from the LED elements 30 and the yellow light obtained by exciting the phosphor 51 in the precipitation phosphor layer 50 with the blue light. In the light-emitting device 1, since the LED elements 30 are directly mounted on the mounted substrate 10 having high heat dissipation, and the phosphor 51 in the precipitation phosphor layer 50 precipitates to the position near the mounted substrate 10, heat generated by the LED elements 30 and the phosphor 51 is, via the mounted substrate 10, easily released to an outside of the device. Accordingly, the reduction in the light emission intensity of the LED elements 30 due to the heat can be prevented, and thus, it is favorable in terms of the improvement of the light emission intensity.

The dispersion phosphor layer 60 is one example of the second resin layer, is configured from a transmissive resin including a phosphor 61 that is a second phosphor, and is provided on the precipitation phosphor layer 50. For the dispersion phosphor layer 60 also, a colorless and transparent resin such as epoxy resin or silicone resin is used. The materials of the dispersion phosphor layer 60 may be the same as or different from that of the precipitation phosphor layer 50. Another transparent resin layer may be provided between the precipitation phosphor layer 50 and the dispersion phosphor layer 60.

The phosphor 61 is, for example, a yellow phosphor that is the same as the phosphor 51. The dispersion phosphor layer 60 includes the phosphor 61 excited by the light from the LED elements 30 at a uniform concentration. In other words, particles of the phosphor 61 in the dispersion phosphor layer 60 uniformly disperse regardless of position in the horizontal direction and the vertical direction as different from the phosphor 51 in the precipitation phosphor layer 50. In the dispersion phosphor layer 60 also, the blue light from the LED elements 30 and the yellow light obtained by exciting the phosphor 61 with the blue are mixed, and accordingly, white light is generated.

In the light-emitting device 1, the dispersion phosphor layer 60 in which the phosphor 61 is uniformly dispersed is provided on the precipitation phosphor layer 50, and thus, the blue light from the precipitation phosphor layer 50 is converted to white light by passing through the dispersion phosphor layer 60. Therefore, even if variations are found among the LED elements 30 in the concentration of the phosphor 51 in the precipitation phosphor layer 50 and a part from which a large amount of blue light is emitted is found, such variations of the light emission are alleviated by the emitted light passing through the dispersion phosphor layer 60. Accordingly, by the presence of the dispersion phosphor layer 60, the color unevenness caused by the variations of the phosphor concentration of the precipitation phosphor layer 50 is not distinct.

Either one or both of the precipitation phosphor layer 50 and the dispersion phosphor layer 60 may, as the phosphors 51 and 61, include multiple types of phosphors such as a green phosphor and a red phosphor. In this case, the light-emitting device 1 emits white light obtained by mixing the blue light from the LED elements 30 which are the blue LEDs and green light and red light which are obtained by exciting the green phosphor and the red phosphor with the blue light. The green phosphor is a particulate phosphor material such as $(BaSr)2SiO4:Eu2+$ that absorbs the blue light emitted from the LED elements 30 and performs the wavelength conversion into the green light. The red phosphor is a particulate phosphor material such as $CaAlSiN3:Eu2+$ that absorbs the blue light emitted from the LED elements 30 and performs the wavelength conversion into the red light.

Either one or both of the precipitation phosphor layer 50 and the dispersion phosphor layer 60 may, as the phosphors 51 and 61, include the yellow phosphor in addition to the green phosphor and the red phosphor, or differently may include a combination of the yellow phosphor and the red phosphor and the like. However, if types of phosphor are increased too much, the total amount of the phosphor is increased and the amount of heat also is large, and thus, it is disadvantageous in terms of the radiation of the heat. Especially, it is preferable that a phosphor that generates a smaller amount of heat than the phosphor 51 in the precipitation phosphor layer 50 is used as the phosphor 61 in the dispersion phosphor layer 60 that is distant from the mounted substrate 10.

FIG. 5(A) to FIG. 5(D) are drawings illustrating examples of concentration distributions of the phosphors in the precipitation phosphor layer 50 and the dispersion phosphor layer 60. A left side of each drawing illustrates, with the pattern of light and shade, the distribution of the particles of the phosphor 51 in the precipitation phosphor layer 50 (precipitation phosphor layers 50A to 50D). A right side of each drawing illustrates a graph of the concentration distribution $f(Z)$ of the phosphor relative to the height direction (Z direction). Hereinafter, the upper surface of the mounted substrate 10 is assumed to be the reference (Z=0) of the height. Although FIG. 5(A) to FIG. 5(D) share the same dispersion phosphor layer 60, FIG. 5(A) to FIG. 5(D) have different concentration distributions of the phosphor 51 in the precipitation phosphor layers 50. The relationship of the phosphor concentrations in the precipitation phosphor layer 50 and the dispersion phosphor layer 60 may be any of four patterns illustrated in FIG. 5(A) to FIG. 5(D).

Figure 5:
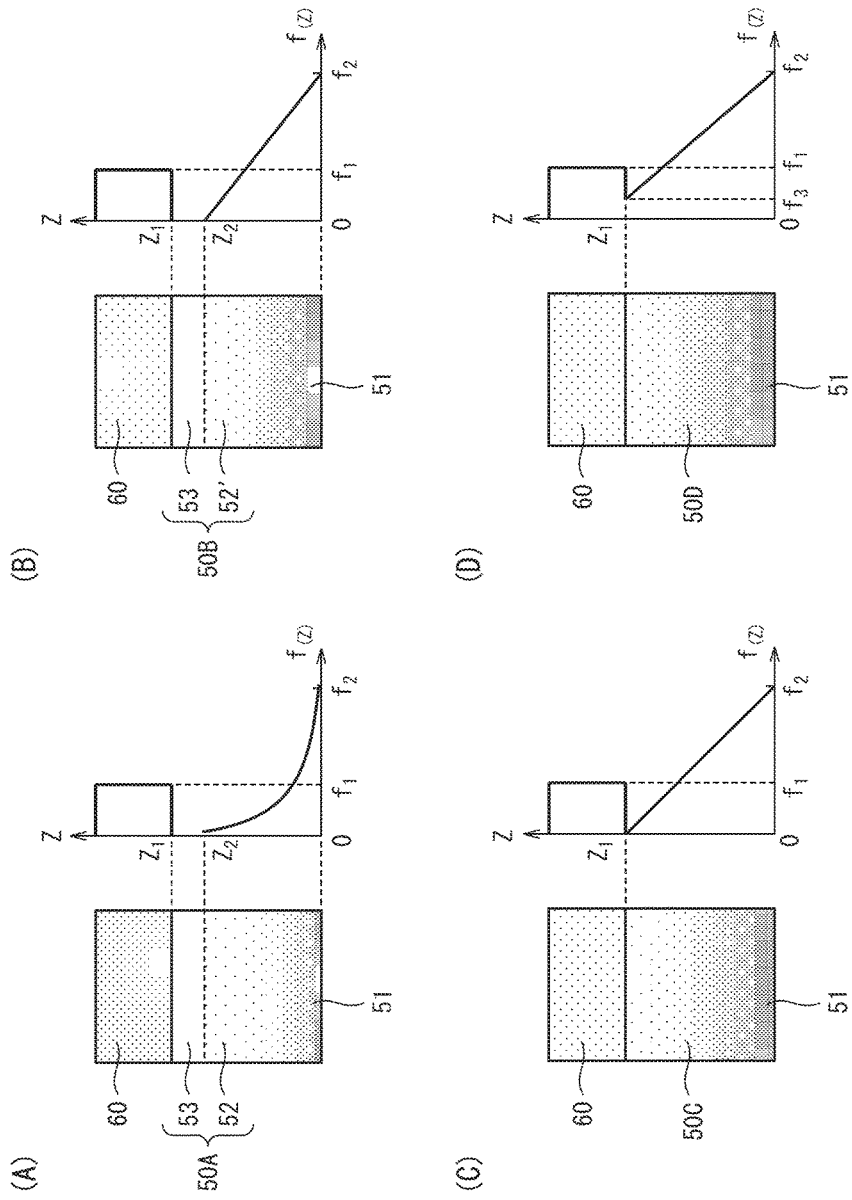
FIGS. 5(A) to (D) are drawings illustrating examples of concentration distributions of the phosphors in the precipitation phosphor layer 50 and the dispersion phosphor layer 60.

In the example of FIG. 5(A), the precipitation phosphor layer 50A includes a transparent resin layer 53 that is at the upper end and is in a height range from Z1 to Z2 (Z1>Z2), and an intermediate concentration layer 52 that includes the phosphor 51 and is in the height range from Z2 to zero. In other words, at directly under the dispersion phosphor layer 60, the transparent resin layer 53 that does not include the phosphor 51 is provided. The phosphor concentration of the dispersion phosphor layer 60 is f1, and the phosphor concentration of the transparent resin layer 53 is zero. As the height approaches from Z2 to zero, the phosphor concentration of the intermediate concentration layer 52 gradually increases from zero, especially in the vicinity of the height zero, the concentration rapidly increases, and in the vicinity of the lower end, the concentration is f2 which is larger than f1.

In the example of FIG. 5(B), the precipitation phosphor layer 50B, as similar to the case of FIG. 5(A), includes a transparent resin layer 53 that is at the upper end and is in the height range from Z1 to Z2, and an intermediate concentration layer 52' that includes the phosphor 51 and is in the height range from Z2 to zero. As the height approaches from Z2 to zero, the phosphor concentration of the intermediate concentration layer 52' linearly increases from zero, and in the vicinity of the lower end, is f2 which is larger than the phosphor concentration f1 of the dispersion phosphor layer 60.

In the example of FIG. 5(C), the precipitation phosphor layer 50C, except for the slight range of the upper end, does not include the transparent resin layer, and the entire precipitation phosphor layer 50C includes the phosphor 51. The phosphor concentration of the precipitation phosphor layer 50C, as the height approaches from Z1 to zero, linearly increases from zero, and in the vicinity of the lower end, the concentration is f2 which is larger than the phosphor concentration f1 of the dispersion phosphor layer 60.

In the example of FIG. 5(D), the precipitation phosphor layer 50D does not include the transparent resin layer at all, and the entire precipitation phosphor layer 50D includes the phosphor 51. The phosphor concentration of the precipitation phosphor layer 50D is, at the upper end having the height of Z1, f3 which is smaller than the phosphor concentration f1 of the dispersion phosphor layer 60, as the height approaches from Z1 to zero, the concentration linearly increases from f3, and in the vicinity of the lower end, the concentration is f2 which is larger than f1.

In all examples of FIG. 5(A) to FIG. 5(D), the phosphor concentration f1 of the dispersion phosphor layer 60 is lower than the phosphor concentration f2 of the portion having the highest concentration in the precipitation phosphor layer 50. In other words, it is preferable that the concentration of the phosphor 61 in the dispersion phosphor layer 60 is lower than the concentration of the phosphor 51 at the lower end of the precipitation phosphor layer 50. Since the dispersion phosphor layer 60 is auxiliary to alleviate the color unevenness caused by the variations of the phosphor concentration in the precipitation phosphor layer 50, the phosphor concentration of the dispersion phosphor layer 60 is preferably not too high to prevent reduction in the brightness of the emitted light that has passed through the dispersion phosphor layer 60. Also, in terms of the radiation of the heat, the phosphor concentration of the dispersion phosphor layer 60 is preferably not too high.

In all examples of FIG. 5(A) to FIG. 5(D), the phosphor concentration f1 of the dispersion phosphor layer 60 is higher than the phosphor concentration zero or f3 of the portion having the lowest concentration in the precipitation phosphor layer 50. In other words, it is preferable that the concentration of the phosphor 61 in the dispersion phosphor layer 60 is higher than the concentration of the phosphor 51 at the upper end (directly under the dispersion phosphor layer 60) of the precipitation phosphor layer 50. If the phosphor concentration of the dispersion phosphor layer 60 is too low, an alleviation effect of the color unevenness may not be acquired, and thus, a certain level of concentration is needed.

In particular, as illustrated in FIG. 5(A) and FIG. 5(B), it is preferable that the upper end (directly under the dispersion phosphor layer 60) of the precipitation phosphor layer 50 is the transparent resin layer 53 that does not include the phosphor 51. As the difference in the phosphor concentration between the dispersion phosphor layer 60 and the upper end of the precipitation phosphor layer 50 is large, the alleviation effect of the color unevenness is more remarkable. Accordingly, the examples of FIG. 5(A) and FIG. 5(B) are more preferable than the examples of FIG. 5(C) and FIG. 5(D), and especially the example of FIG. 5(A) is the most preferable.

Unlike the examples of FIG. 5(A) to FIG. 5(D), if the phosphor concentration f1 of the dispersion phosphor layer 60 is lower than the phosphor concentration f3 at the upper end (directly under the dispersion phosphor layer 60) of the precipitation phosphor layer 50, the alleviation effect of the color unevenness by the dispersion phosphor layer 60 may not be acquired.

An upper limit of the phosphor concentration of the dispersion phosphor layer 60 is determined by a relationship between the temperature increment quantity by the phosphor 61 of the dispersion phosphor layer 60 and the heatproof temperature of the resin configuring the dispersion phosphor layer 60. A lower limit of the phosphor concentration of the dispersion phosphor layer 60 is determined by a relationship among the degree of variations of the phosphor concentration in the precipitation phosphor layer 50, the alleviation degree of the color unevenness by the dispersion phosphor layer 60, and the tolerable range of the color unevenness. As the phosphor concentration of the dispersion phosphor layer 60 is high, the color unevenness is not distinct. However, as described above, since there is an upper limit in the phosphor concentration, an actual amount of the phosphor 61 that is dispersed and mixed in the dispersion phosphor layer 60 is experimentally determined.

When the light-emitting device that includes the precipitation phosphor layer 50 is actually produced, since the concentration distribution of the phosphor 51 is different for each product, the chromaticity of the emitted light is also different for each product in accordance with the degree of variations of the phosphor concentration in the precipitation phosphor layer 50. However, if the phosphor concentration of the dispersion phosphor layer 60 is adjusted, the chromaticity difference for each product can be cancelled out so that the chromaticity of the emitted light is within the tolerable range. Accordingly, by providing the dispersion phosphor layer 60 on the precipitation phosphor layer 50, the failure rate of the product can be lowered.

To alleviate the nonuniformity of the brightness, provision of a diffusion layer instead of the dispersion phosphor layer can be considered. However, for example, when there is a portion where locally a large amount of blue light is present, even if the blue light is diffused with the diffusion layer, the color unevenness is still present. In this case, if the yellow light is added to the blue light by the dispersion phosphor layer, the color unevenness is more indistinct, and thus for the purpose of alleviating the color unevenness, it is preferable to use the dispersion phosphor layer instead of the diffusion layer.

Figure 6:
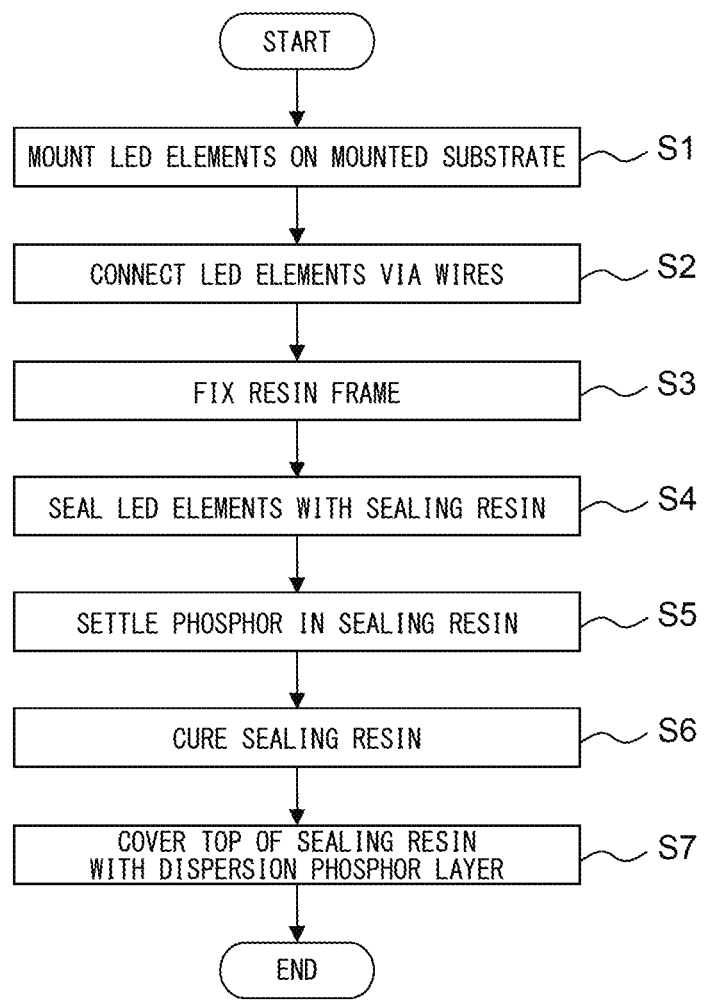
FIG. 6 is a flowchart illustrating an example of production processes of the light-emitting device 1.

FIG. 6 is a flowchart illustrating an example of production processes of the light-emitting device 1. In producing the light-emitting device 1, first, as illustrated in FIG. 3, the LED elements 30 are mounted on the mounting area 11 of the mounted substrate 10 to which the circuit substrate 20 is pasted (S1). The LED elements 30 are connected to each other via the wires 31, and each LED element 30 is connected to the conductive patterns 23A and 23B via the wires 31 (S2). Next, along the edge of the opening 21, the resin frame 40 is fixed on the circuit substrate 20 (S3).

Subsequently, with an uncured sealing resin including the phosphor 51 that is excited by the light from the LED elements 30, all the LED elements 30 are integrally sealed (S4). While keeping the layer of the sealing resin in an uncured state, the phosphor 51 in the sealing resin is precipitated (settled) on the side of the mounted substrate 10 (S5). Thereafter, by curing the sealing resin, the precipitation phosphor layer 50 is formed (S6). Finally, the top of the precipitation phosphor layer 50 (sealing resin) is covered with the dispersion phosphor layer 60 that includes the phosphor 61 excited by the light from the LED elements 30 at a uniform concentration (S7). Accordingly, the light-emitting device 1 illustrated in FIG. 1 and FIG. 2 is completed.

Figure 7:
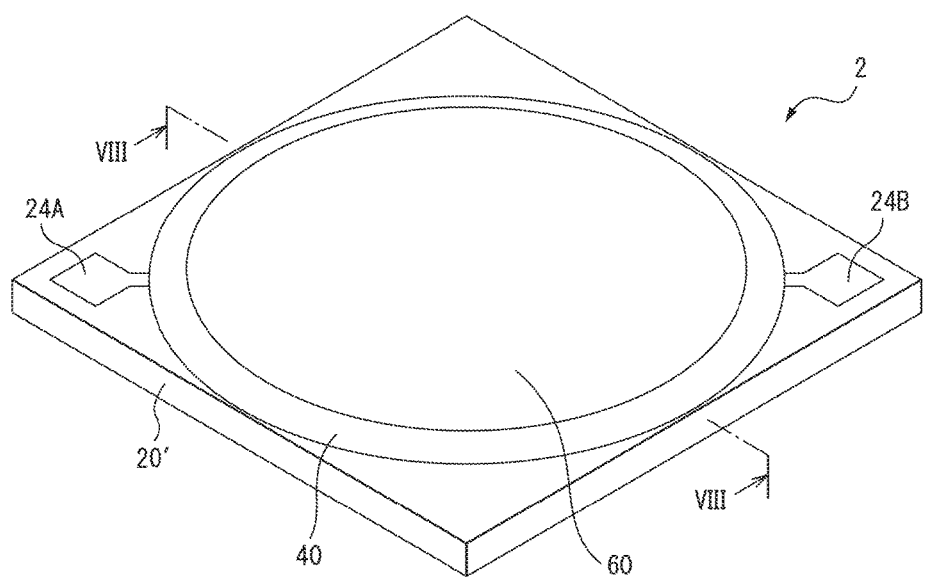
FIG. 7 is a perspective view of another light-emitting device 2.
Figure 8:
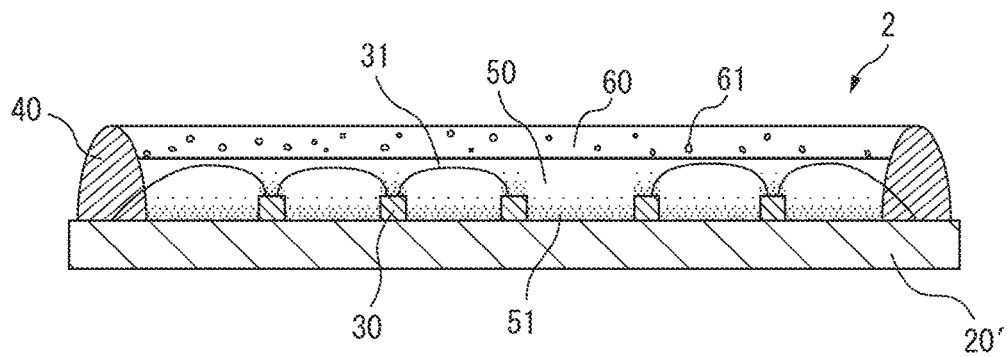
FIG. 8 is a cross-sectional view taken along a line VIII-VIII of FIG. 7.

FIG. 7 is a perspective view of another light-emitting device 2. FIG. 8 is a cross-sectional view taken along a line VIII-VIII of FIG. 7. The light-emitting device 2 is different from the light-emitting device 1 in that, instead of the mounted substrate 10 and the circuit substrate 20 of the light-emitting device 1, a ceramic substrate 20' is included, but other configurations are the same as those of the light-emitting device 1. The ceramic substrate 20' is a flat substrate and has an upper surface on which conductive patterns and the connection electrodes 24A and 24B are formed and the LED elements 30 are mounted, and the ceramic substrate 20' serves as the mounted substrate and the circuit substrate. Even when the ceramic substrate 20' without having an opening is used, as illustrated in FIG. 8, the precipitation phosphor layer 50 and the dispersion phosphor layer 60 which are the same as those of the light-emitting device 1 may be used. In the light-emitting device 2 also, as similar to the light-emitting device 1, by the presence of the dispersion phosphor layer 60, the color unevenness caused by the variations of the phosphor concentration in the precipitation phosphor layer 50 is indistinct.

The invention claimed is:
1. A light-emitting device comprising:
a substrate;

a plurality of light-emitting elements that are mounted on the substrate in a lattice manner;

a first resin layer that integrally seals the plurality of light-emitting elements and includes a first phosphor that is excited by light from the plurality of light-emitting elements at a concentration that is high as it goes to a lower end near the substrate from an upper end distant from the substrate; and a second resin layer that is disposed on an upper side of the first resin layer via an interface, the second resin layer including a second phosphor that is the same as the first phosphor, at a uniform concentration, wherein the first phosphor is precipitated on upper surfaces of the light-emitting elements and the upper surface of the substrate between the light-emitting elements, and the second phosphor is uniformly dispersed in the second resin layer at a concentration lower than the concentration of the first phosphor at the lower end of the first resin layer, and thereby generates a smaller amount of heat than the first phosphor.

2. The light-emitting device according to claim 1, wherein the concentration of the second phosphor in the second resin layer is higher than the concentration of the first phosphor at the upper end of the first resin layer.

3. The light-emitting device according to claim 2, wherein the upper end of the first resin layer is a transparent resin layer that does not include the first phosphor.

4. The light-emitting device according to claim 1, wherein the interface comprises the upper side of the first resin layer and a lower side of the second resin layer, wherein the lower side of the second interface layer is in contact with the upper side of the first resin layer.

5. The light-emitting device according to claim 1, wherein the concentration of the second phosphor in the second resin layer above the interface is higher than the concentration of the first phosphor directly under the interface.

6. A method for manufacturing a light-emitting device comprising the steps of:

mounting a plurality of light-emitting elements on a substrate;

integrally sealing the plurality of light-emitting elements using an uncured resin that includes a first phosphor excited by light from the plurality of light-emitting elements and thereby forming a first resin layer;

precipitating the first phosphor at a side of the substrate while keeping the first resin layer in an uncured state, thereby arranging the first phosphor on upper surfaces of the light-emitting elements and the upper surface of the substrate between the light-emitting elements, and;

curing the first resin layer; and providing, at an upper side of the first resin layer, a second resin layer in which a second phosphor that is the same as the first phosphor is uniformly dispersed at a concentration lower than the concentration of the first phosphor at the lower end of the first resin layer, after the first resin layer is cured, so that the second phosphor generates a smaller amount of heat than the first phosphor.

7. The method of claim 6, wherein the provided second resin layer comprises the second phosphors.

* * * * *